United States Patent [19]

Stinehelfer

[11] 4,409,675

[45] Oct. 11, 1983

[54] ADDRESS GATE FOR MEMORIES TO PROTECT STORED DATA, AND TO SIMPLIFY MEMORY TESTING, AND METHOD OF USE THEREOF

[75] Inventor: Jonathan J. Stinehelfer, Sunnyvale, Calif.

[73] Assignee: Fairchild Camera & Instrument Corporation, Mountain View, Calif.

[21] Appl. No.: 219,294

[22] Filed: Dec. 22, 1980

[51] Int. Cl.³ .................... G11C 7/00; G11C 29/00
[52] U.S. Cl. ................................. 365/201; 371/21; 365/230
[58] Field of Search ............ 365/230, 231, 233, 236, 365/242, 189, 201; 371/21

[56] References Cited

U.S. PATENT DOCUMENTS

| | | | |
|---|---|---|---|
| 3,624,620 | 11/1971 | Andrews | 365/230 |
| 3,757,310 | 9/1973 | Croxon et al. | 365/230 |
| 4,195,358 | 3/1980 | Yuen | 365/230 |

Primary Examiner—John C. Martin
Attorney, Agent, or Firm—Kenneth Olsen; Michael J. Pollock; Carl L. Silverman

[57] ABSTRACT

An address gate for a random access memory includes a pair of emitter-coupled and collector-coupled transistors, and another transistor emitter-coupled to the pair of transistors. Complimentary outputs are read at the coupled emitters of the pair of transistors and the collector of the other transistor respectively, there being an input signal applied to the base of one of the pair of transistors, and a control signal applied to the base of the other of the pair of transistors, which overrides the operation of one of the pair of transistors when the control signal is in its high state.

1 Claim, 3 Drawing Figures

ADDRESS GATE FOR MEMORIES TO PROTECT STORED DATA, AND TO SIMPLIFY MEMORY TESTING, AND METHOD OF USE THEREOF

BACKGROUND OF THE INVENTION

This invention relates to address gates for a random access memory, and further to the addressing of such a memory.

In a typical two-transistor address gate, a constant or threshold voltage $V_{TH}$ is applied to the base of one transistor, while a varying input signal is applied to the base of the other transistor, with complimentary outputs being read at the respective collectors of the transistors. It is common practice in emitter-coupled logic random access memories to use phasing of input timing signals to increase the apparent random access memory speed. In practice, for example, a random access memory may be designed to be addressed at 48 nanosecond intervals, but in order to increase speed, the gate address might be, for example, made to change every 12 nanoseconds. The complimentary outputs of the gate, communicating with a decoder, might then be forced to change readings every 12 nanoseconds. It has been found that the current design of address gates and decoders are able to operate at such speed. However, the random access memory, being designed to operate at a slower speed, cannot respond to this level of speed, which could lead to data errors in the contents of the random access memory.

SUMMARY OF THE INVENTION

It is accordingly an object of this invention to overcome the above problems, and also to provide addressing of a random access memory in an efficient and rapid manner, leading to a high degree of efficiency and reduced time in the testing of such a memory.

Broadly stated, the invention comprises an address gate for a random access memory comprising a first transistor having an emitter, base and collector, the base of the first transistor adapted to receive a first signal, a second transistor having an emitter, base and collector, the base of the second transistor adapted to receive a second signal, a third transistor having an emitter, base and collector, the base of the third transistor adapted to receive a third signal, the first, second and third transistors being emitter-coupled, the first and second transistors being collector-coupled, the collectors of the first, second and third transistors being adapted to receive power from a power source.

The invention further comprises a method of addressing a random access memory comprising in order the steps of addressing the memory at a particular address, addressing the memory at an address other than said particular address, and addressing the memory at said particular address.

The invention further comprises apparatus for sequentially addressing a random access memory comprising means for addressing the memory at a particular address, means for addressing the memory at an address other than said particular address immediately subsequent to said addressing the memory at said particular address, and means for addressing the memory only at said particular address immediately subsequent to said addressing the memory at said address other than said particular address.

BRIEF DESCRIPTION OF THE DRAWINGS

Other objects of the invention will become apparent from a study of the following specification and drawings, in which.

DESCRIPTION OF THE PREFERRED EMBODIMENT

Figure 1:
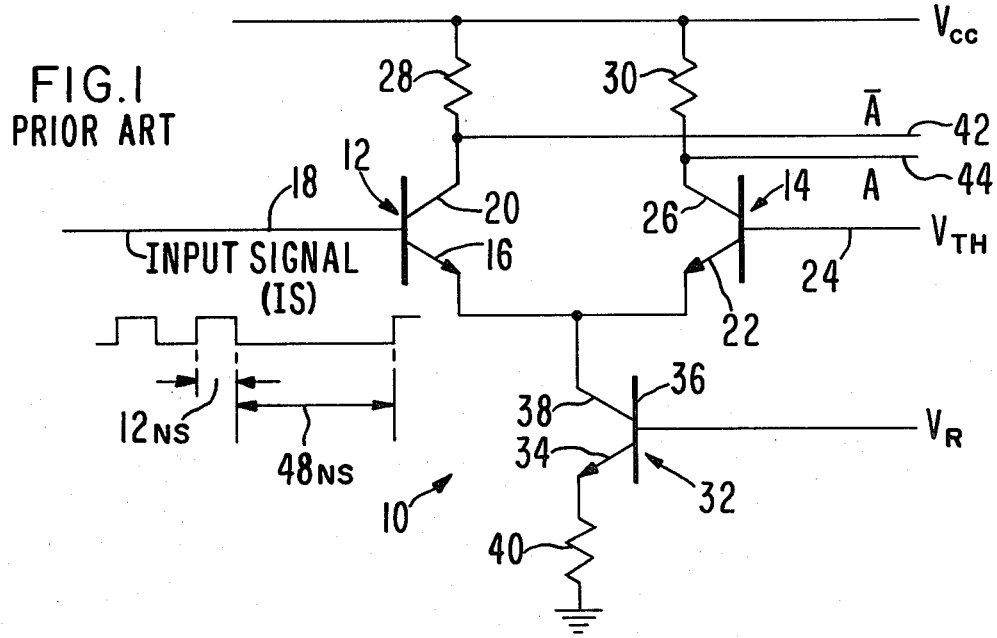
FIG. 1 is a schematic view of an address gate circuit of the prior art.

Shown in FIG. 1 is the address gate 10 as is well-known in the prior art. The address gate 10 includes first and second transistors 12, 14, the transistor 12 including an emitter 16, base 18 and collector 20, and the transistor 14 also including an emitter 22, base 24 and collector 26. The transistors 12, 14 are emitter-coupled, and resistors 28, 30 connect the collectors 20, 26 respectively with a power source $V_{CC}$. The emitters 16, 22 communicate with another transistor 32 having an emitter 34, base 36 and collector 38, the emitter 34 thereof communicating with a resistor 40 in turn communicating with ground. Address lines 42, 44 communicate with the collectors 20, 26 respectively.

In operation, an input signal (IS) (FIG. 1) is applied to the base 18 of the transistor 12, changing at 12 nanosecond intervals and then holding at its low value during a 48 nanosecond period, during which the memory is addressed, as is well-known. A constant threshold voltage $V_{TH}$ is applied to the base 24 of the transistor 14, and a constant reference voltage $V_R$ is applied to the base 18 of the transistor 32. With, for example, IS low, transistor 12 is off, and transistor 14 is on, having $V_{TH}$ applied to the gate 24 thereof. Thus, output A of line 42 will be high, and output A of line 44 will be low. Assuming then that IS goes high, transistor 12 is turned on. The emitter 16 of transistor 12 is raised with the input signal, raising the emitter 22 of the transistor 14, turning transistor 14 off. Thus, the output of line 42 is low, while the output of line 44 is high.

The transistor 32, with the reference voltage $V_R$ applied to the base 36 therof, is included to insure that current from $V_{CC}$ to ground is the same whether the input signal to the transistor 12 is high or low, i.e., whether transistor 12 is on and the transistor 14 is off, or transistor 14 is on and the transistor 12 is off.

While the outputs of such an address gate 10 are capable of properly responding to changes in the input signal IS every 12 nanoseconds, as described above, such a speed may cause data errors in the contents of a random access memory.

Figure 2:
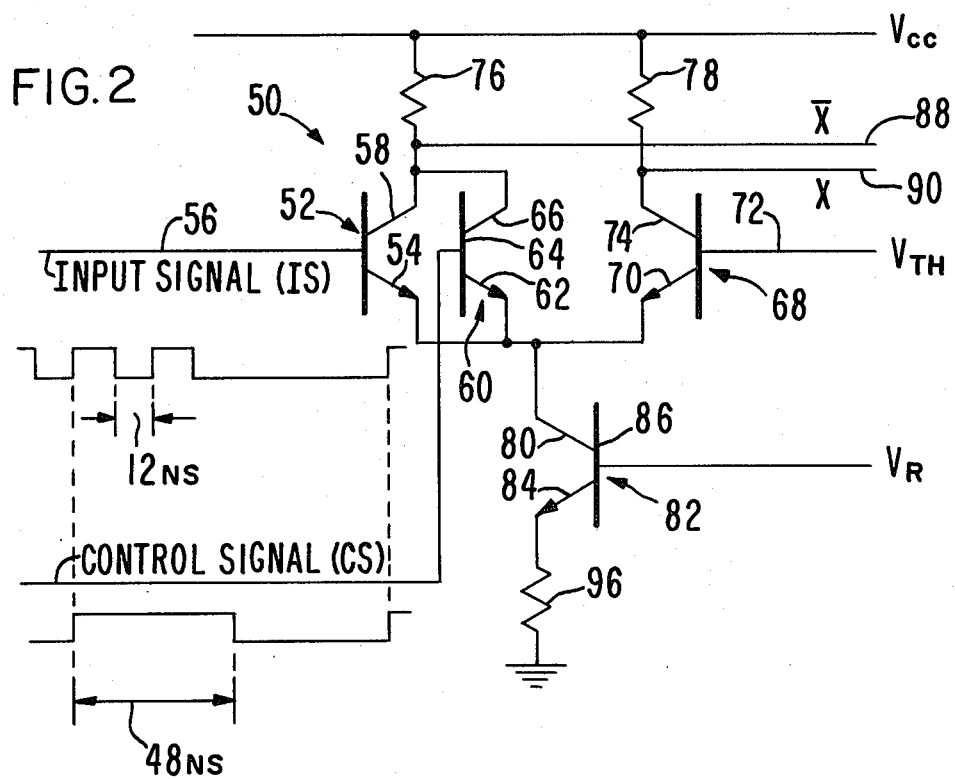
FIG. 2 is a schematic view of the address gate of the present invention.

Shown in FIG. 2 is the circuit 50 which is the subject of the present invention. In that circuit, a first transistor 52 is included, in turn including an emitter 54, a base 56 and collector 58. A second transistor 60 is included, also including an emitter 62, base 64 and collector 66, and a third transistor 68 is included, in turn including an emitter 70, base 72 and collector 74. The three transistors 52, 60, 68 are emitter-coupled, and the transistor 52 and transistor 60 are collector-coupled. A resistor 76 connects to the collectors 58, 66 of the transistors 52, 60 and a resistor 78 connects to the collector 74 of the transistor 68. A voltage source $V_{CC}$ is applied to the resistor 76, 78. The emitters 54, 62, 70 of the transistors 52, 60, 68 are connected to the collector 80 of a transistor 82 and the emitter 84 of that transistor 82 connects to a resistor 96 in turn connected to ground. An address line 88 is connected to the collectors 58, 66 of the transistors 52, 60 and an address line 90 is connected to the collector 74 of the transistor 68.

Again, an input signal IS changing at 12 nanosecond intervals and then holding low for 48 nanoseconds is applied to the base 56 of the transistor 52. A control signal CS is applied to the base 64 of the transistor 50, with the change in control signal occurring at 48 nanosecond intervals. The rise in the control signal takes place at substantially the same time as a rise in the input signal subsequent to the 48 nanosecond low period of IS. The low of the control signal is less than or equal to the low of the input signal, and the high of the control signal is greater than or equal to the high of the input signal.

In operation, with the control signal low, transistor 60 is off, and the circuit operates exactly the same as the circuit shown in FIG. 1, with the memory being addressed during that time period. However, with CS high, transistor 50 is on for a 48 nanosecond period, independent of IS applied to the transistor 52. Thus, for that 48 nanosecond period, $\overline{X}$ is low, while X is high. It will thus be seen that the data stored in a random access memory is protected from rapid movement of the address lines. Again, a constant threshold voltage $V_{TH}$ is applied to the base 72 of the transistor 68 and a constant reference voltage $V_R$ is applied to the base 86 of the transistor 82.

Figure 3:
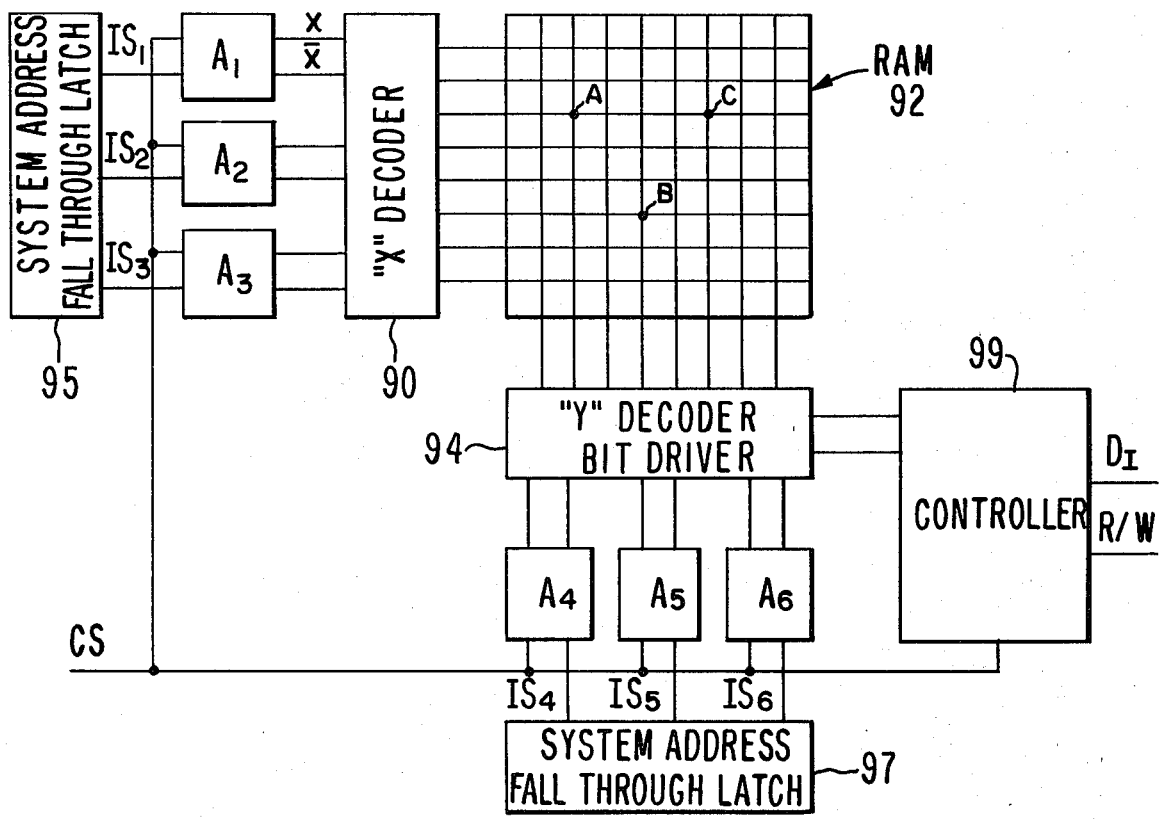
FIG. 3 is a schematic view of a system incorporating address gates of the type shown in FIG. 2.

Shown in FIG. 3 is a schematic view for demonstrating use of the address gate with a random access memory. Address gates $A_1$, $A_2$, and $A_3$ communicate with an X decoder 90 in turn communicating by means of 8 bit lines with a random access memory 92. Address gates $A_4$, $A_5$, and $A_6$ communicate with a Y decoder 94 in turn communicating with the random access memory 92 by means of 8 bit lines. A controller 99 communicates with the Y decoder, for reading and writing the memory, write information being supplied on a data line 101 with the control in the write mode. Each of the address gates $A_1$, $A_2$, $A_3$ receives its individual input signal respectively ($IS_1$, $IS_2$, $IS_3$) from a system address fall through latch 95 which is in the hold mode when IS is low for 48 nanoseconds, and is in the fall through mode when IS is in other than the low 48 nanosecond periods. Likewise the address gates $A_4$, $A_5$, $A_6$ receive individual input signals ($IS_4$, $IS_5$, $IS_6$) from a system address fall through latch 97. However, the control signal CS is applied to each input gate as shown in FIG. 2 (and also the controller 101). Thus, when the control signal CS is low, it is applied in its low state to the appropriate transistor of each gate $A_1$ through $A_6$, so that the input signals $IS_1$, $IS_2$, etc. are used to provide addressing of the memory 92. However, when the control signal CS goes high, the output X, $\overline{X}$ of each gate is established, so that a particular address in the memory is addressed, determined by CS going high.

It will be seen that the memory 92 may be addressed for testing with advantage through the use of the present system. That is, the memory 92 will be addressed only at a particular address, for example, address A, with the control signal CS in its high state. With the control signal CS low, the memory 92 is addressed at an address other than the particular address A (for example, address B), through signals $IS_1$, $IS_2$, etc. from latches in the hold mode. However, when the control signal CS again goes high, the memory 92 is again addressed only at said particular address A immediately subsequently to B being addressed.

The method for testing the full memory would further comprise the steps of addressing the memory 92 at an address not previously addressed and other than the particular address A, for example, address C, and addressing the memory at the particular address A, and then repeating the steps until all the addresses in the memory 92 have been addressed. Thus, since a particular address A is always returned to between the addressing of any points other than the particular address A, the number of steps necessary to test the full memory is much lower than the number of steps which would be necessary in going from any of the possible addresses to any of the other possible addresses.

The technology disclosed herein is applicable to making synchronous random access memories.

I claim:

1. A method of addressing a random access memory comprising in order the steps of:
    addressing the memory at a particular address; addressing the memory at an address other than said particular address;
    (i) addressing the memory at said particular address;
    (ii) addressing the memory at an address not previously addressed and other than said particular address, and repeating said steps (i) and (ii) until all addresses in the memory have been addressed.

* * * * *